United States Patent
Van Puymbroeck

(10) Patent No.: US 6,627,091 B1
(45) Date of Patent: Sep. 30, 2003

(54) METHOD FOR PRODUCING PRINTED CIRCUIT BOARDS WITH ROUGH CONDUCTING STRUCTURES AND AT LEAST ONE AREA WITH FINE CONDUCTING STRUCTURES

(75) Inventor: Jozef Van Puymbroeck, Oostkamp (BE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/743,567

(22) PCT Filed: Jul. 1, 1999

(86) PCT No.: PCT/EP99/04568
§ 371 (c)(1),
(2), (4) Date: Jan. 10, 2001

(87) PCT Pub. No.: WO00/04750
PCT Pub. Date: Jan. 27, 2000

(30) Foreign Application Priority Data

Jul. 13, 1998 (DE) .......................... 198 31 341

(51) Int. Cl.⁷ .............................. H05K 3/06; H05K 1/02
(52) U.S. Cl. ............................ 216/13; 216/41; 430/318
(58) Field of Search ................... 216/13, 19, 41, 216/49, 51; 430/312, 313, 318

(56) References Cited

U.S. PATENT DOCUMENTS

| 3,574,012 A | * | 4/1971 | Penberg .................. 118/504 |
| 4,312,897 A | | 1/1982 | Reimann ..................... 427/96 |
| 4,527,041 A | | 7/1985 | Kai ....................... 219/121 LN |
| 4,718,977 A | * | 1/1988 | Contiero et al. ............. 438/648 |
| 5,131,978 A | * | 7/1992 | O'Neill ........................ 216/2 |
| 6,391,791 B1 | * | 5/2002 | Sasaki et al. ............... 438/725 |
| 6,492,070 B1 | * | 12/2002 | Kobinata ....................... 430/5 |
| 2003/0000916 A1 | * | 1/2003 | De Steur et al. ............. 216/13 |

FOREIGN PATENT DOCUMENTS

| DE | 32 45 272 | 6/1984 |
| DE | 37 32 249 | 5/1990 |
| DE | 38 37 950 | 5/1990 |
| DE | 41 31 065 | 3/1993 |
| EP | 0 062 300 | 10/1982 |
| EP | 0 602 258 | 6/1994 |
| GB | 2 213 325 | 8/1989 |

OTHER PUBLICATIONS

"Handbuch der Leiterplattentechnik", 1982; Sect. 16.4, Multiwire–EDV–Programme, p. 294.

* cited by examiner

*Primary Examiner*—Anita Alanko
(74) *Attorney, Agent, or Firm*—Harness, Dickey & Pierce, P.L.C.

(57) ABSTRACT

A method for producing printed circuit boards having coarse conductor structures and at least one region having fine conductor structures. The coarse conductor structures and the fine conductor structures are etched out of a metal layer in a common etching process. An etching resist patterned by means of photolithography is used in the region of the coarse conductor structures, and an etching resist patterned with the aid of a laser beam is used in the region of the fine conductor structures.

11 Claims, 4 Drawing Sheets

METHOD FOR PRODUCING PRINTED CIRCUIT BOARDS WITH ROUGH CONDUCTING STRUCTURES AND AT LEAST ONE AREA WITH FINE CONDUCTING STRUCTURES

BACKGROUND OF THE INVENTION

1. Field of the Invention

The present invention generally pertains to the field of methods of making printed circuit boards. In particular, the present invention pertains to method of making printed circuit boards having high conductor track densities.

2. Discussion of the Related Art

Various methods or producing printed circuit boards have been presented.

For instance, DE 32 45 272 discloses a method for producing miniaturized thick- and thin-film circuits in which, for the purpose of significantly increasing the conductor track density first of all at least on those regions of the substrate at which a miniaturized conductor track geometry is provided, a whole-area layer of conductive material is applied and this layer is then subdivided by means of a laser. The laser is controlled according to a negative layout program and is aligned with respect to the substrate into mutually separate partial areas and/or strips which at least in part form a conductor track. When a multiplicity of IC pads are connected to a surrounding periphery, diverging tracks burnt by the laser result in the production of conductor tracks which diverge in a star-shaped manner. The tracks are very narrow on the IC side and are each assigned to one of the closely adjacent pads and the widened outer ends of which lead to periphery connections. As a result of the track burnt by the laser being routed in the shape of a spiral, inductances can also be formed in the conductive layer in a whole-area manner. In this case, a highly compact and thus space-saving inductance structure can be obtained by the spiral arrangement of the conductor track located in each case between two tracks burnt by the laser.

Also, EP 0 602 258 discloses a method for producing printed circuit boards having coarse conductor structures. A delimited region of these printed circuit boards is intended to obtain a very high wiring density. This is achieved by means of an additional wiring layer which is applied only in the delimited region and is connected to the underlying wiring layer via plated-through holes.

In EP 0 062 300, a method for producing printed circuit boards is disclosed in which a metallic etching resist that has been applied over the whole area of a metal layer is selectively removed by means of laser radiation in the regions which do not correspond to conductor structures. The conductor structures are formed by etching away the uncovered metal layer.

Furthermore, DE 41 31 065 discloses a method for producing printed circuit boards in which a metal layer and a metallic or organic etching resist layer are successively applied to a substrate. The etching resist layer is then removed by means of laser radiation in the regions directly adjoining the subsequent conductor track pattern, and the uncovered metal layer is etched away so that the conductor track pattern and island regions of the metal layer remain on the substrate. The island regions are electrically insulated from the conductor track pattern by etching trenches. Patterning by means of laser radiation can be performed rapidly since the regions of the etching resist layer which are to be removed only have to have a small width and the larger areas remain between two conductor tracks.

In principle, the production of the fine conductor structures would also be possible using conventional but costly photoetching technology. In this case however, high-quality photoresists, high-quality light sources and high-quality photomasks, would have to be used, and the work would have to be carried out in dust-free rooms. All these measures can be obviated by the application of laser patterning for the fine conductor structures, while at the same time giving a very high yield.

However, the present invention solves the problem of producing printed circuit boards having a high conductor track density in at least one delimited region, in an economical and simple manner.

The present invention combines conventional photoetching technology for producing the coarse conductor structures and laser patterning for producing the fine conductor structures. The method sequences can be coordinated with one another in such a way that the formation of the coarse and fine conductor structures can be performed in a common etching process.

For the purposes of discussing the present invention, coarse conductor structures are structures which have conductor track widths and conductor track spacings of more than 100 um, whereas fine conductor structures are structures which have conductor track widths and conductor track spacings of 100 um or less.

SUMMARY OF THE INVENTION

Accordingly, it is an object of the invention to provide a method of making printed circuit boards having plated-through holes both in a region of coarse conductor structures and in a region of fine conductor structures.

It is another object of the invention to provide a method of making printed circuit boards having extremely reliable plated-through holes through the metallic reinforcing layer in the region of the coarse conductor structures.

It is a further object of the invention to provide a method of making printed circuit boards in which protection is provided for the region having one conductor structures during the deposition of the metallic reinforcing layer in the region of the coarse conductor structures.

It is an additional object of the invention to provide a method of making printed circuit boards in which photoresist is patterned with the aid of a laser beam in the region of fine conductor structures.

It is yet another object of the invention to provide a method of making printed circuit boards in which an etching resist can be applied to the coarse and to the fine conductor structures in one work operation.

It is yet a further object of the invention to provide a method of making printed circuit boards in which the region having fine conductor structures is protected during the application of the metallic reinforcing layer by a temporary mask.

It is yet an additional object of the invention to provide a method of making printed circuit boards that easily enables direct laser patterning of the etching resist in the region of the fine conductor structures.

These and other objects of the present invention will become apparent upon careful review of the following disclosure, which is to be read in conjunction with review of the accompanying drawing figures.

DETAILED DESCRIPTION OF THE PREFERRED EMBODIMENTS

Figure 1:
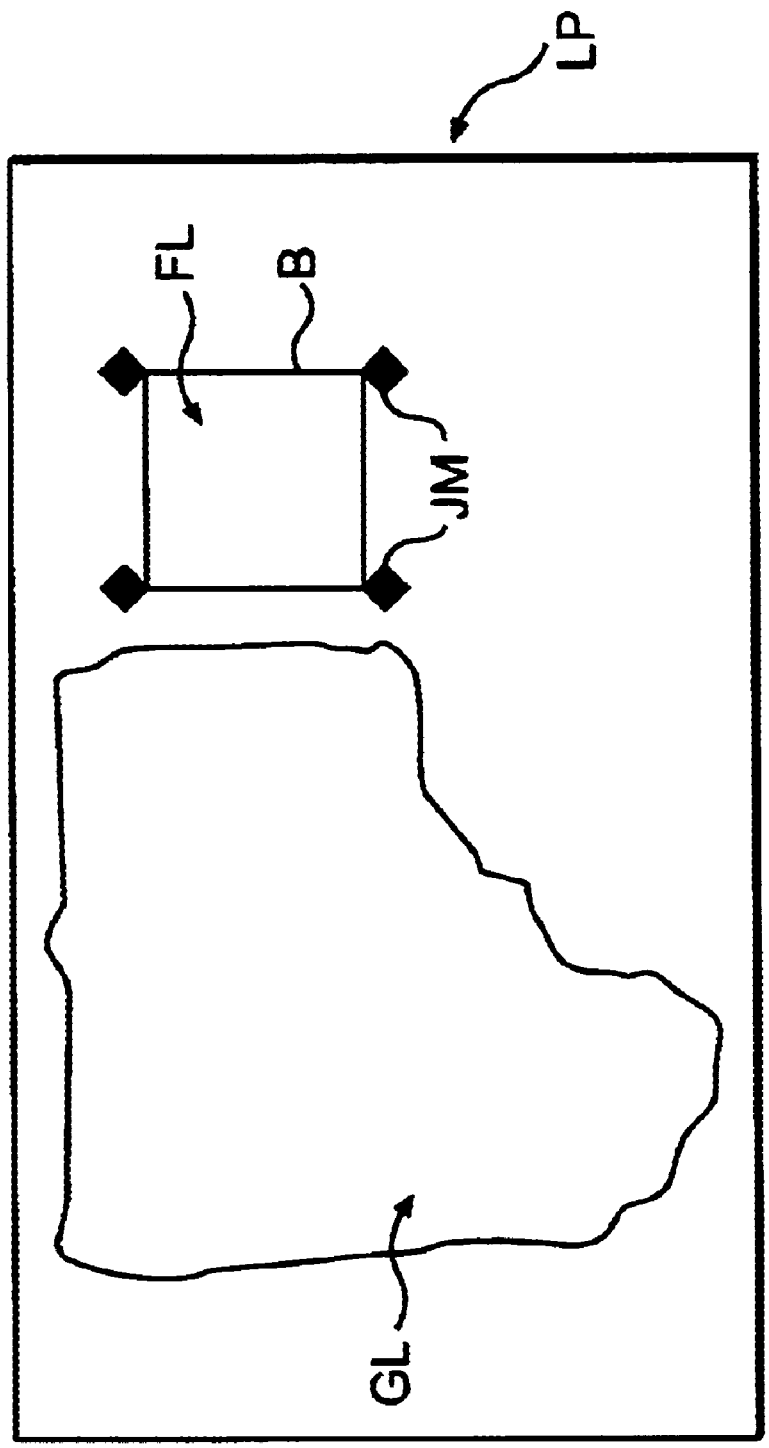
FIG. 1 shows a plan view of a printed circuit board having coarse conductor structures and a region having fine conductor structures.

FIG. 1 shows, in a greatly simplified schematic illustration, a plan view of a printed circuit board, which is designated in its entirety by LP and on the surface of which there are a region having coarse conductor structures GL, which region is only indicated by a contour line, and a delimited region B having fine conductor structures FL, which likewise cannot be discerned in any detail. There are four alignment markers JM in the corner points of the region B, which markers enable the respective devices to be positioned exactly when working in the region B.

FIGS. 2a through 2h show various method stages of a first embodiment of a method for producing printed circuit boards having coarse conductor structures and a region having fine conductor structures according to the present invention.

In the individual sections through an electrically insulating substrate S, the region for the coarse conductor structures is in each case situated to the left of a dotted line L, while the region of the fine conductor structures is situated to the right of said dotted line L.

Figure 2A:
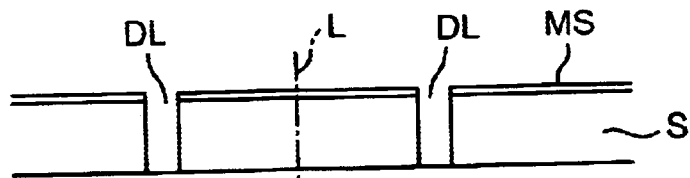
FIGS. 2a through 2h show various method stages according to the present invention.

In accordance with FIG. 2a, a metal layer MS is applied to the substrate 3, whereupon plated-through holes DL are bored in the region having coarse conductor structures and in the region having fine conductor structures. The metal layer MS is a copper coating, for example.

In accordance with FIG. 2b, a metallization layer ME is subsequently applied to the metal layer MS and to the walls of the plated through holes DL e.g. by chemical and electrical copper deposition.

Figure 2B:
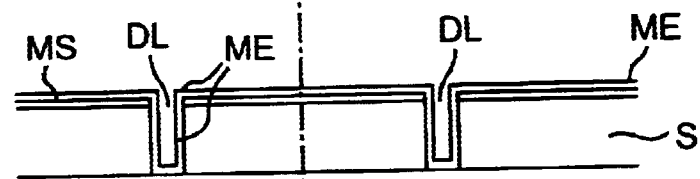
Figure 2C:
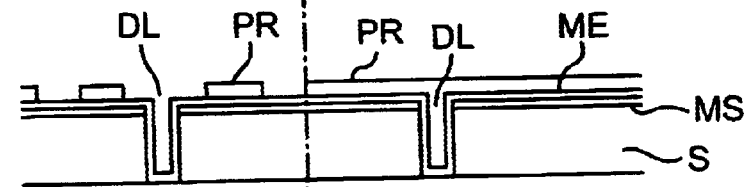
Figure 2D:
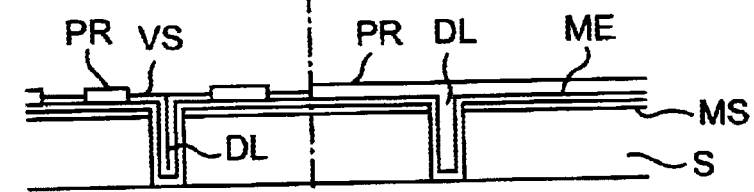

Afterwards, in accordance with FIG. 2c, a photoresist PR is applied and is patterned by exposure and development in such a way that, in the region of the coarse conductor structures, it has a negative pattern of said coarse conductor structures and, on the other hand, covers the entire region of the fine conductor structures. In accordance with FIG. 2d, a reinforcing layer VS is then applied to those regions of the metallization layer ME which are not covered by the photoresist PR, and in particular in the plated-through holes DL, e.g. by electrical copper deposition. The task of this reinforcing layer VS is to increase the reliability of the plated-through holes.

Figure 2E:
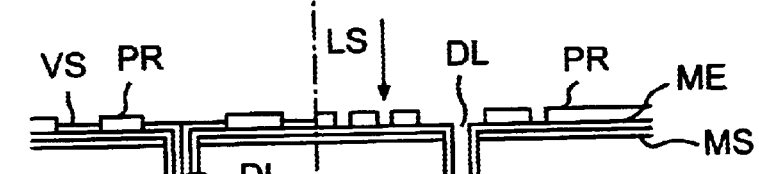

In accordance with FIG. 2e, the photoresist PR is then patterned in the region of the fine conductor structures with the aid of a laser beam LS in such a way that it has the negative patterning of the fine conductor structures. By way of example, an Nd:YAG laser having a wavelength of 1.06 um or 355 nm is used for this laser patterning.

Figure 2F:
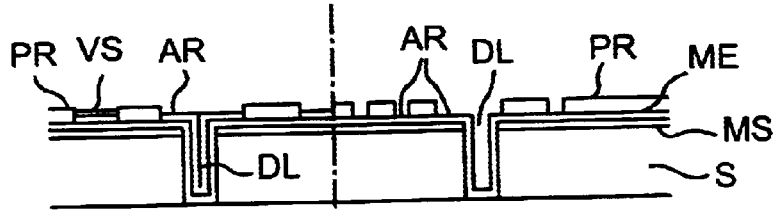

Afterwards, in accordance with FIG. 2f, an etching resist AR is applied to the coarse conductor structures and to the fine conductor structures in one work operation. In the exemplary embodiment illustrated, the etching resist AR is applied by electrodeposition of tin.

Figure 2G:
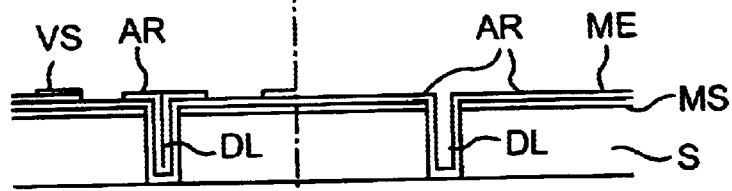
Figure 2H:
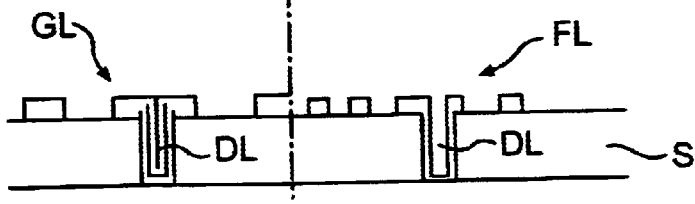

After the removal—illustrated in FIG. 2g—of the photoresist PR, the coarse conductor structures GL and the fine conductor structures FL are then produced in a common etching process in accordance with FIG. 2h. In this common etching process, those regions of the metallization layer ME and of the metal layer MS which are not protected by the etching resist AR are etched away as far as the surface of the substrate S. In a final step, the residual etching resist AR is then stripped.

FIGS. 3a through 3h show various method stages a second embodiment of a method for producing printed circuit boards having coarse conductor structures and a region having fine conductor structures according to the present invention.

Figure 3A:
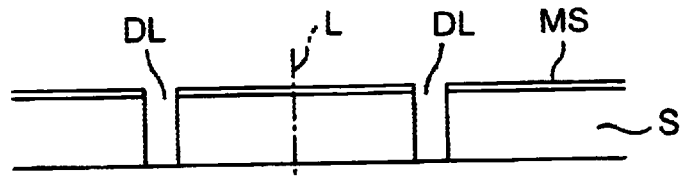
FIGS. 3a through 3h show other various method stages according to the present invention.
Figure 3B:
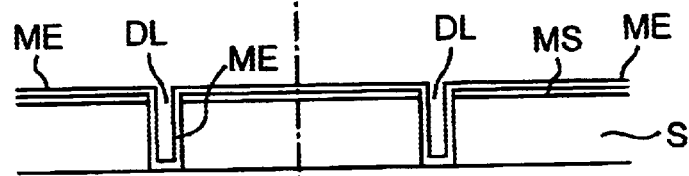

In this case, FIGS. 3a and 3b correspond to FIGS. 2a and 2b already described.

Figure 3C:
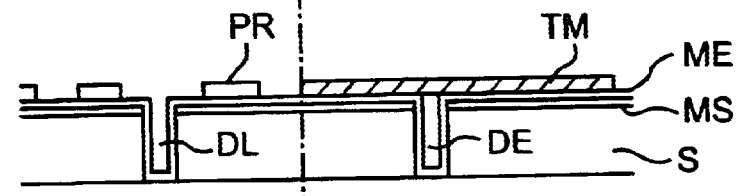
Figure 3D:
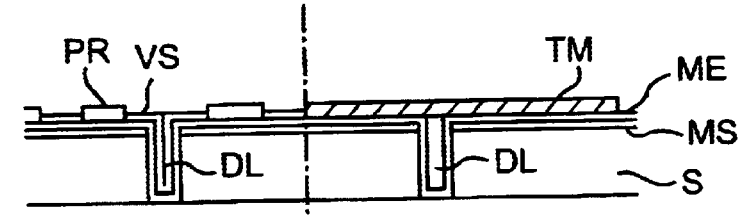

In accordance with FIG. 3c, a photoresist PR is applied to the metallization layer ME and is patterned by exposure and development in such a way that, in the region of the coarse conductor structures, it has a negative pattern of said coarse conductor structures. In the region of the fine conductor structures, a temporary mask designated by TM is applied to the metallization layer ME. Afterwards, in accordance with FIG. 3d, a reinforcing layer VS is applied to the metallization layer ME in the region of the coarse conductor structures.

Figure 3E:
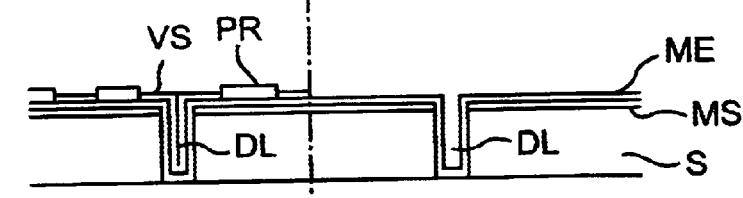
Figure 3F:
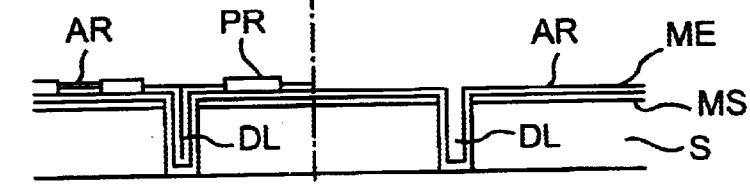

After the removal of the temporary mask TM in accordance with FIG. 3e, an etching resist AR is then applied to the coarse conductor structures and to the region of the fine conductor structures in one work operation in accordance with FIG. 3f. In the exemplary embodiment illustrated, the etching resist AR is applied by chemical deposition of tin.

Figure 3G:
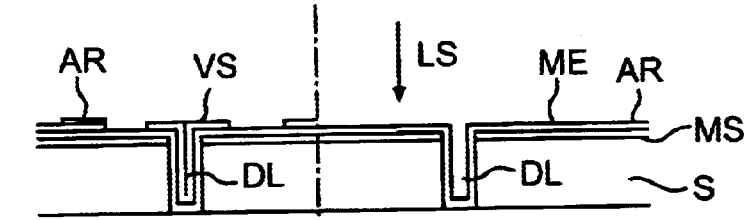

In accordance with FIG. 3g, the photoresist PR is subsequently removed and the etching resist AR is patterned in the region of the fine conductor structures with the aid of a laser beam LS in such a way that it has the pattern of the fine conductor structures. An Nd:YAG laser having a wavelength of 1.06 um is used for this laser patterning of the etching resist AR.

Figure 3H:
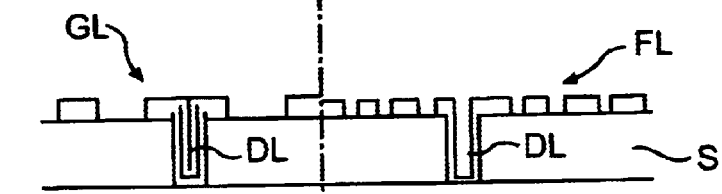

In accordance with FIG. 3h, the coarse conductor structures GL and the fine conductor structures FL are then produced in a common etching process. In this common etching process, those regions of the metallization layer ME and of the metal layer MS which are not protected by the etching resist AR are etched away as far as the surface of the substrate S. In a final step, the residual etching resist AR is then again stripped in this case, too.

FIGS. 4a through 4h show various method stages of a third embodiment of a method for producing printed circuit boards having coarse conductor structures and a region having fine conductor structures according to the present invention.

Figure 4A:
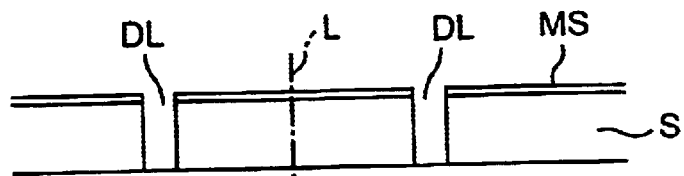
FIGS. 4a through 4h show other various method stages according to the present invention.
Figure 4B:
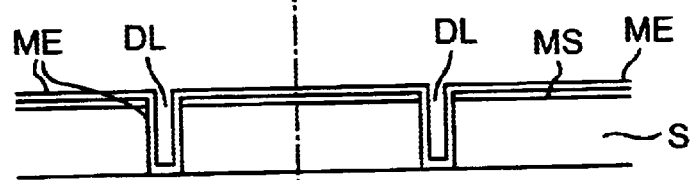

FIGS. 4a and 4b correspond to FIGS. 2a and 2b already described.

Figure 4C:
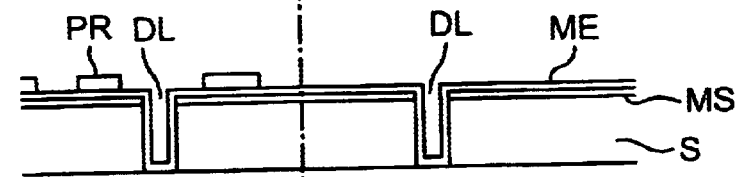

In accordance with FIG. 4c, a photoresist PR is applied to the metallization layer ME and is patterned by exposure and development in such a way that, in the region of the coarse conductor structures, it has a negative pattern of said coarse conductor structures.

Figure 4D:
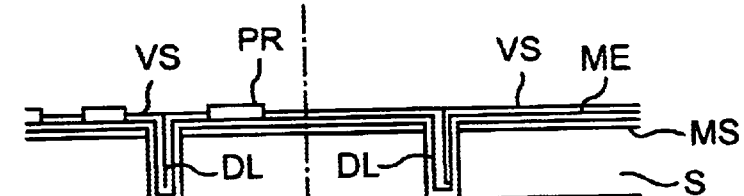

Afterwards, in accordance with FIG. 4d, a reinforcing layer VS is applied to the metallization layer ME, said reinforcing layer VS covering the entire region of the fine conductor structures in a whole-area manner.

Figure 4E:
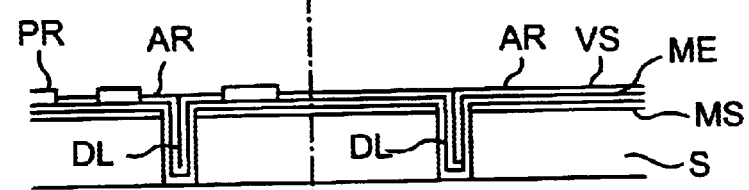

In accordance with FIG. 4e, an etching resist AR is then applied to the reinforcing layer VS. In the exemplary embodiment illustrated, the etching resist AR is applied by chemical deposition of tin.

Figure 4F:
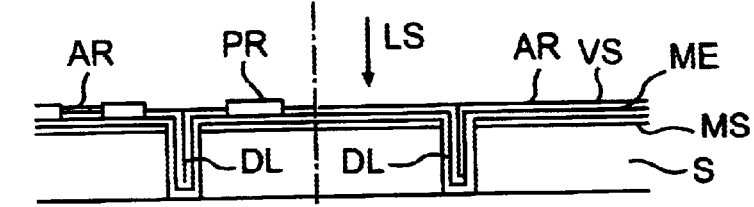

In accordance with FIG. 4f, the etching resist AR is subsequently patterned in the region of the fine conductor structures with the aid of a laser beam LS in such a way that it has the pattern of the fine conductor structures. An Nd:YAG laser having a wavelength of 1.06 um is used for this laser patterning of the etching resist AR.

Figure 4G:
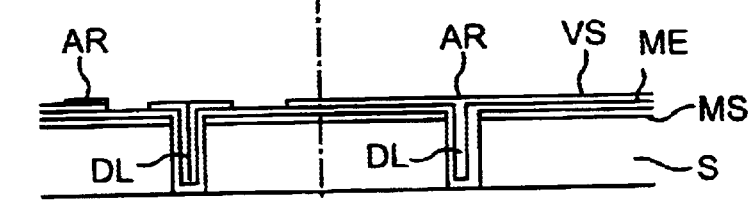

After this laser patterning, the photoresist PR is removed in accordance with FIG. 4g.

Figure 4H:
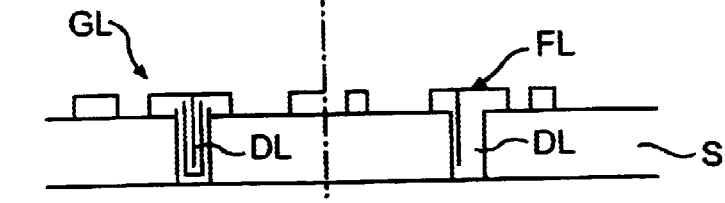

In accordance with FIG. 4h, the coarse conductor structures GL and the fine conductor structures FL are then produced in a common etching process. In this case, in the region of the coarse conductor structures GL, those regions of the metallization layer ME and of the metal layer MS which are not protected by the etching resist AR are etched away as far as the surface of the substrate S. In the region of the fine conductor structures FL, those regions of the reinforcing layer VS, of the metallization layer ME and of the metal layer MS which are not protected by the etching resist AR is etched away as far as the surface of the substrate S. After this common etching process, the residual etching resist AR is stripped.

Although organic resists, such as electro-dip coating resist, can also be used as the etching resist, a chemical or electrical deposition of metallic etching resists is preferred. In which case, the use of tin or tin-lead as etching resist has proved to be particularly successful.

If the etching resist disturbs the further treatment of the printed circuit board, it is removed again. In which case, it is then possible to apply other metal layers to the coarse and to the fine conductor structures.

Although preferred embodiments of the invention have been described herein, it is to be understood that the inventions is not limited to these embodiments and that various changes and modifications there may be made without departing from the scope or spirit of the invention, which is defended by the following claims.

What is claimed is:

1. A method for producing printed circuit boards having coarse conductor structures and at least one delimited region having fine conductor structures, the method comprising the steps of:

applying a metal layer to an electrically insulated substrate;

applying an etching resist patterned by photolithography to the metal layer in the region to have coarse conductor structures, the etching resist having the pattern of the coarse conductor structures;

applying an etching resist patterned by a laser beam to the metal layer in the region to have the fine conductor structures, the etching resist having the pattern of the fine conductor structures; and etching away to the surface of the substrate in a common etching process, the regions of the metal layer not protected by the etching resist, to form the coarse conductor structures and the fine conductor structures.

2. The method of claim 1, further comprising the step of:

introducing plated-through holes into the metal layer and the substrate in the region of the course conductor structures and/or the region of the fine conductor structures, and applying a metallization layer to the metal layer and to the walls of the plated through holes.

3. The method of claim 2, further comprising the step of:

applying a photoresist to the metallization layer at least in the region of the coarse conductor structures, patterning the photoresist by exposure and development such that the photoresist has a negative pattern corresponding to the coarse conductors structures, and applying a metallic reinforcing layer to the metallization layer.

4. The method of claim 3, further comprising the step of:

applying a photoresist to the region having fine conductor structures, and covering said region during application of the metallic reinforcing layer.

5. The method of claim 4, further comprising the step of:

patterning the photoresist after the application of the metallic reinforcing layer in the region having fine conductor structures with the aid of a laser beam such that the photoresist has the negative structures of the fine structures.

6. The method of claim 5, further comprising the step of:

applying the etching resist to the coarse conductor structures and to the fine conductor structures in one work operation such that the photoresist is removed.

7. The method of claim 6, further comprising the step of:

covering the region having fine conductor structures by a temporary mask during application of the metallic reinforcing layer.

8. The method of claim 7, further comprising the step of:

applying the etching resist over the whole area of the metal layer, and patterning the etching resist with the aid of a laser beam such that the etching resist has the pattern of the fine conductor structures.

9. The method of claim 8, further comprising the step of:

applying the etching resist by chemical or electrical metal deposition in one work operation in the region having coarse conductor structures and in the region having fine conductor structures.

10. The method of claim 9, further comprising the step of:

using tin or tin-lead as the etching resist.

11. The method of claim 10 further comprising the step of:

removing the etching resist again.

* * * * *